United States Patent
Kunimoto

(10) Patent No.: US 10,477,703 B2
(45) Date of Patent: Nov. 12, 2019

(54) WIRING BOARD

(71) Applicant: SHINKO ELECTRIC INDUSTRIES CO., LTD., Nagano (JP)

(72) Inventor: Yuji Kunimoto, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/161,494

(22) Filed: Oct. 16, 2018

(65) Prior Publication Data

US 2019/0191572 A1 Jun. 20, 2019

(30) Foreign Application Priority Data

Dec. 19, 2017 (JP) .................. 2017-243258

(51) Int. Cl.
| | |
|---|---|
| H05K 1/02 | (2006.01) |
| H05K 3/46 | (2006.01) |
| H05K 1/11 | (2006.01) |
| H05K 1/03 | (2006.01) |
| H05K 3/38 | (2006.01) |

(52) U.S. Cl.
CPC ......... *H05K 3/4644* (2013.01); *H05K 1/0222* (2013.01); *H05K 1/03* (2013.01); *H05K 1/112* (2013.01); *H05K 3/388* (2013.01); *H05K 2201/0175* (2013.01); *H05K 2201/0179* (2013.01); *H05K 2201/0707* (2013.01); *H05K 2201/0723* (2013.01)

(58) Field of Classification Search
CPC .............................................. H05K 2201/0723
See application file for complete search history.

(56) References Cited

U.S. PATENT DOCUMENTS

| | | | | |
|---|---|---|---|---|
| 6,436,735 B1* | 8/2002 | Goetz | ................... | H01L 22/20 257/701 |
| 8,188,377 B2* | 5/2012 | Hu | .................. | H05K 1/111 174/258 |
| 8,362,367 B2 | 1/2013 | Komatsu | | |
| 2004/0211979 A1* | 10/2004 | Shioiri | ............... | H05K 1/0233 257/199 |
| 2006/0079081 A1* | 4/2006 | Hsu | ................ | H05K 3/243 438/618 |

FOREIGN PATENT DOCUMENTS

| | | | | |
|---|---|---|---|---|
| JP | 2005-109306 | * | 4/2005 | ......... H01L 23/552 |
| JP | 2010-087508 | | 4/2010 | |

* cited by examiner

*Primary Examiner* — Hung V Ngo
(74) *Attorney, Agent, or Firm* — IPUSA, PLLC

(57) ABSTRACT

A wiring board includes an insulator layer, a wiring layer including a wiring pattern and formed on one surface of the insulator layer, an inorganic layer covering a region of the one surface of the insulator layer not formed with the wiring layer, and covering an upper surface and side surfaces of the wiring pattern along a concavo-convex of the wiring pattern, and a shield part covering the wiring pattern via the inorganic layer.

12 Claims, 3 Drawing Sheets

WIRING BOARD

CROSS-REFERENCE TO RELATED APPLICATION

This application is based upon and claims priority to Japanese Patent Application No. 2017-243258, filed on Dec. 19, 2017, the entire contents of which are incorporated herein by reference.

FIELD

Certain aspects of the embodiments discussed herein are related to a wiring board, and a wiring board manufacturing method.

BACKGROUND

Recently, it is desirable to reduce the size of wiring patterns of wiring boards to micro wiring patterns, in order to cope with demands to reduce the size of electronic devices and to increase signal transmission rates or speeds of the electronic devices. For this reason, various kinds of structures have been proposed for the wiring boards having the micro wiring patterns. For example, Japanese Laid-Open Patent Publication No. 2010-87508 proposes one example of the wiring board having the micro wiring patterns.

On the other hand, crosstalk noise occurs when the size of the wiring pattern is reduced to the micro wiring pattern. Hence, as a measure against the crosstalk noise, structures including a microstrip structure in which a planar layer is provided above or below a wiring pattern, a coplanar structure in which a shield pattern, such as ground or the like, is inserted between wiring patterns, or the like have been studied.

However, according to the microstrip structure or the coplanar structure, the number of layers of the wiring board increases to make the wiring board thick, because the planar layer is inserted. In addition, in the case of the coplanar structure, a density of signal wirings decreases because of the shield pattern that is inserted between the wiring patterns, and as a result, the number of layers of the wiring board increases to make the wiring board thick.

SUMMARY

Accordingly, it is an object in one aspect of the embodiments to provide a wiring board and a wiring board manufacturing method, which can take measures against crosstalk noise without increasing the number of layers.

According to one aspect of the embodiments, a wiring board includes a first insulator layer; a first wiring layer, including a first wiring pattern, formed on one surface of the first insulator layer; a first inorganic layer covering a region of the one surface of the first insulator layer not formed with the first wiring layer, and covering an upper surface and side surfaces of the first wiring pattern along a concavo-convex of the first wiring pattern; and a first shield part covering the first wiring pattern via the first inorganic layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
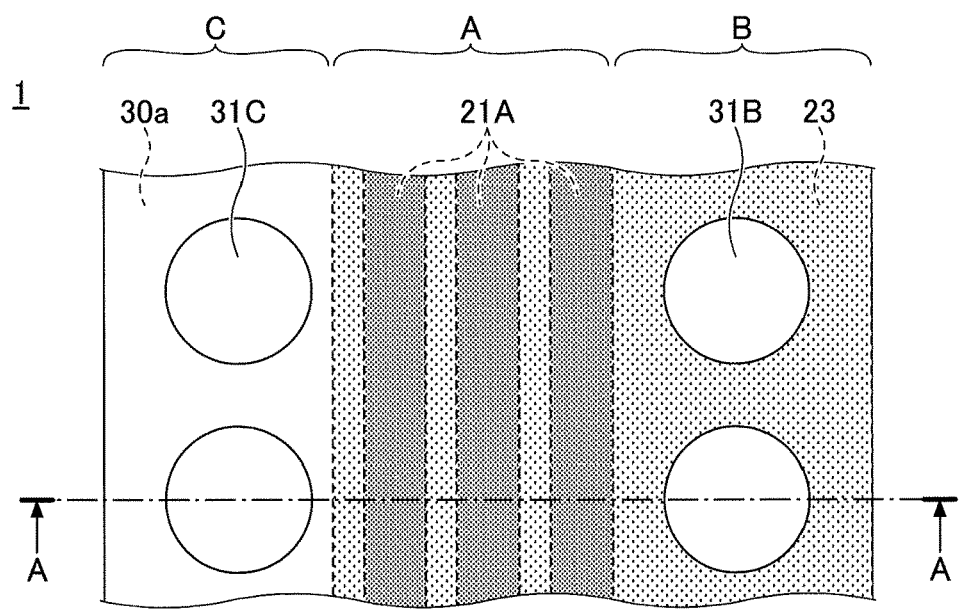
FIG. 1A and FIG. 1B are diagrams illustrating an example of a wiring board in a first embodiment.

Preferred embodiments of the present invention will be described with reference to the accompanying drawings. In the drawings, those parts that are the same are designated by the same reference numerals, and a repeated description of the same parts may be omitted.

A description will now be given of a wiring board and a wiring board manufacturing method in each embodiment according to the present invention.

First Embodiment

[Structure of Wiring Board in First Embodiment]

Figure 1B:
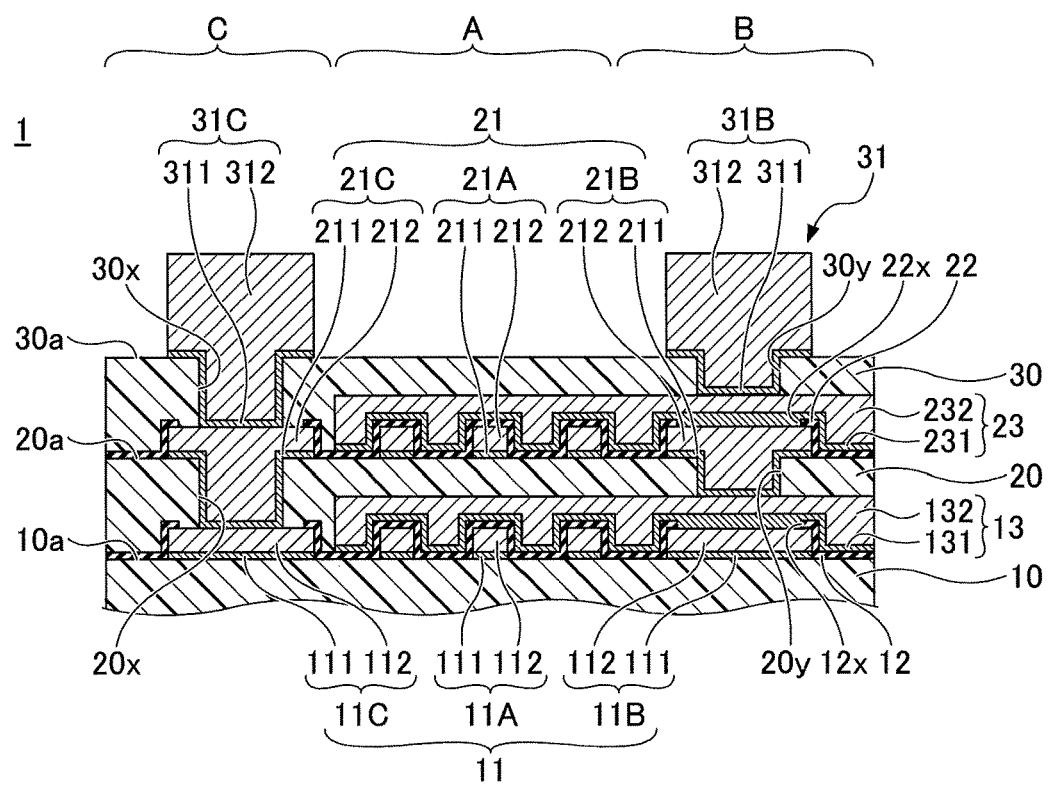

First, a structure of a wiring board in a first embodiment will be described. FIG. 1A and FIG. 1B are diagrams illustrating an example of the wiring board in the first embodiment. FIG. 1A is a partial plan view of the wiring board, and FIG. 1B is a cross sectional view along a line A-A in FIG. 1A. For the sake of convenience, FIG. 1A illustrates a wiring pattern 21A and a shield part 23 by halftone dot patterns. In addition, FIG. 1A and FIG. 1B illustrate only a representative part illustrated in FIG. 2A through FIG. 2E which will be described later.

As illustrated in FIG. 1A and FIG. 1B, a wiring board 1 includes an insulator layer 10, a wiring layer 11, an inorganic layer 12, a shield part 13, an insulator layer 20, a wiring layer 21, an inorganic layer 22, a shield part 23, an insulator layer 30, and a wiring layer 31. The wiring board 1 may have a structure that enables a plurality of semiconductor chips to be mounted on a surface of the wiring board 1 formed with the wiring layer 31, for example.

In this embodiment, a first surface of the wiring board 1 where the insulator layer 30 is formed, may also be referred to as "an upper surface" or "one surface" of the wiring board 1. A second surface of the wiring board 1, opposite to the first surface, where the insulator layer 10 is formed, may also be referred to as "a lower surface" or "the other surface" of the wiring board 1. In addition, a first surface of each part of the wiring board 1, closer to the insulator layer 30 than to the insulator layer 10 and approximately parallel to the upper surface (or one surface) of the wiring board 1, may also be referred to as "an upper surface" or "one surface" of each part. A second surface of each part of the wiring board 1, opposite to the first surface of each part, closer to the insulator layer 10 than to the insulator layer 30, and approximately parallel to the lower surface (or the other surface) of the wiring board 1, may also be referred to as "a lower surface" or "the other surface" of each part. Of course, the wiring board 1 may be used in an upside-down state in which the upper and lower surfaces of the wiring board 1 are reversed, or in a tilted state in which the wiring board 1 is titled by a certain angle from a horizontal state. Further, a plan view of each part of the wiring board 1 refers to a top view of each part that is viewed in a normal direction to one surface 30a of the insulator layer 30, and a planar shape of each part of the wiring board 1 refers to a shape of each part viewed in the normal direction to the one surface 30a of the insulator layer 30.

Other arbitrary layers, such as other wiring layers, insulator layers, via wirings, core layers, or the like, may be formed under the insulator layer 10. The layers formed under the insulator layer 10 may include a layer having a resin as a main component thereof, a layer having silicon as the main component thereof, a layer having a ceramic as the main component thereof, or the like.

The main component of a material may amount to more than 50 vol %, and more preferably more than 70 vol % in the material.

The insulator layer 10 may be formed by an insulator resin or the like having an epoxy resin or a polyimide resin as the main component thereof, for example. In addition, the insulator resin may be a thermosetting insulator resin or a photosensitive insulator resin, for example. The insulator layer 10 may include a filler, such as silica ($SiO_2$) or the like. The layers under the insulator layer 10 may be build-up layers all made of the thermosetting insulator resin or the photosensitive insulator resin. Alternatively, the layers under the insulator layer 10 may include both build-up layers made of the thermosetting insulator resin and build-up layers made of the photosensitive insulator resin. The insulator layer 10 may have a thickness of approximately 5 μm to approximately 10 μm, for example.

The wiring layer 11 is formed on one surface 10a of the insulator layer 10. The wiring layer 11 includes a wiring pattern 11A formed in a region A, a shield pad 11B formed in a region B, and a signal pad 11C formed in a region C. An arrangement of the region A, the region B, and the region C illustrated in FIG. 1B is merely an example, and the arrangement of the region A, the region B, and the region C may be arbitrary.

Although the wiring pattern 11A, the shield pad 11B, and the signal pad 11C of the wiring layer 11 are illustrated in FIG. 1B using different reference numerals, the wiring pattern 11A, the shield pad 11B, and the signal pad 11C may be formed by the same process using the same material. The wiring pattern 11A, the shield pad 11B, and the signal pad 11C may have a structure in which an electroplated layer 112 is stacked on a seed layer 111.

The seed layer 111 may have a stacked structure in which a copper (Cu) layer is formed on a titanium (Ti) layer, for example. Adhesion between the insulator layer 10 and the seed layer 111 can be improved by providing the titanium (Ti) layer in the seed layer 111. The seed layer 111 may have a thickness of approximately 100 nm to approximately 300 nm, for example. The electroplated layer 112 may be made of a material such as copper (Cu) or the like, for example. The electroplated layer 112 may have a thickness of approximately 1 μm to approximately 5 μm, for example.

Line/space or line-and-space of the wiring pattern 11A may be approximately 1 μm/1 μm to approximately 5 μm/5 μm, for example. The planar shape of each of the shield pad 11B and the signal pad 11C may be a circular shape having a diameter of approximately 10 μm to approximately 50 μm, for example. The line of the line/space refers to a width (or wiring width) of the wiring pattern, and the space of the line/space refers to a spacing (or wiring interval) between two mutually adjacent wiring patterns. For example, the line/space of 2 μm/2 μm refers to a wiring pattern having a wiring width of 2 μm and a wiring interval of 2 μm.

The inorganic layer 12 is an insulator layer that covers a region of the one surface 10a of the insulator layer 10 not formed with the wiring layer 11, and also covers an upper surface and side surfaces of the wiring layer 11 along a concavo-convex of the wiring layer 11.

In other words, the inorganic layer 12 covers the region of the one surface 10a of the insulator layer 10 not formed with the wiring layer 11, and also covers an upper surface and side surfaces of the wiring pattern 11A along a concavo-convex of the wiring pattern 11A. In addition, the inorganic layer 12 covers an upper surface and side surfaces of the shield pad 11B along a concavo-convex of the shield pad 11B. Further, the inorganic layer 12 covers an upper surface and side surfaces of the signal pad 11C along a concavo-convex of the signal pad 11C.

The inorganic layer 12 includes an opening 12x. The opening 12x exposes a region (or central part) of the upper surface of the shield pad 11B excluding an outer edge part of the upper surface of the shield pad 11B. The opening 12x also exposes a region (or central part) of the upper surface of the signal pad 11C excluding an outer edge part of the upper surface of the signal pad 11C. Of course, the opening 12x may expose the entire region on the upper surface of the shield pad 11B. In addition, the opening 12x may expose the entire region on the upper surface of the signal pad 11C.

An inorganic material forming the inorganic layer 12 is not limited to a particular material. Examples of the inorganic material forming the inorganic layer 12 include silicon oxide ($SiO_2$), alumina ($Al_2O_3$), or the like, for example. The inorganic layer 12 may have a thickness of approximately 10 μm to approximately 300 μm, for example.

Because the inorganic layer 12 is thin (that is, a thin film), the inorganic layer 12 is formed along the shapes of the wiring pattern 11A, the shield pad 11B, and the signal pad 11C, but does not fill a space between the adjacent wiring patterns 11A nor spaces between the wiring pattern 11A and each of the shield pad 11B and the signal pad 11C. In other words, the inorganic film 12 also has a concavo-convex shape.

The shield part 13 covers the wiring pattern 11A via the inorganic layer 12. The shield part 13 extends on the wiring pattern 11A, and covers the shield pad 11B via the inorganic layer 12. The shield part 13 fills a concavo-convex formed by the adjacent wiring patterns 11A and a concavo-convex formed by the wiring pattern 11A and the shield pad 11B that are adjacent, to form a planar layer on the wiring pattern 11A and the shield pad 11B. This planar layer has a flat upper surface. The shield part 13 is electrically connected to the shield pad 11B that is exposed within the opening 12x of the inorganic layer 12.

The shield part 13 may have a structure in which an electroplated layer 132 is stacked on a seed layer 131. The seed layer 131 may have a stacked structure in which a copper (Cu) layer is formed on a titanium (Ti) layer, for example. Adhesion between the inorganic layer 12 and the seed layer 131 can be improved by providing the titanium (Ti) layer in the seed layer 131. The seed layer 131 may have a thickness of approximately 100 nm to approximately 300 nm, for example. The electroplated layer 132 may be made of a material such as copper (Cu) or the like, for example. The electroplated layer 132 may have a thickness of approximately 1 μm to approximately 5 μm, for example.

The insulator layer 20 is formed on the one surface 10a of the insulator layer 10, to cover an outer edge part of the signal pad 11C that is exposed within the opening 12x of the inorganic layer 12, and the shield part 13. A material forming the insulator layer 20 may be a photosensitive resin having a phenol resin or a polyimide resin as the main component thereof, for example. The material forming the insulator layer 20 may be the same as, or may be different from, the material forming the insulator layer 10. The insulator layer 20 may have a thickness of approximately 5 µm to approximately 10 µm, for example. The insulator layer 20 may include a filler such as silica ($SiO_2$) or the like.

The wiring layer 21 is formed on one surface 20a of the insulator layer 20. The wiring layer 21 includes a wiring pattern 21A formed in the region A, a shield pad 21B formed in the region B, and a signal pad 21C formed in the region C.

The shield pad 21B is electrically connected to the shield part 13 that is exposed within a via hole 20y formed in the insulator layer 20, through the via hole 20y. More particularly, the shield pad 21B is formed on the one surface 20a of the insulator layer 20 at a position in a periphery of the via hole 20y that penetrates the insulator layer 20 and exposes a part of the upper surface of the shield part 13. The shield pad 21B extends within the via hole 20y to fill the via hole 20y, and electrically connects to the shield part 13.

The signal pad 21C is electrically connected to the signal pad 11C that is exposed within the via hole 20x formed in the insulator layer 20, through the via hole 20x. More particularly, the signal pad 21C is formed on the one surface 20a of the insulator layer 20 at a position in a periphery of the via hole 20x that penetrates the insulator layer 20 and exposes a part of the upper surface of the signal pad 11C. The signal pad 21C extends within the via hole 20x to fill the via hole 20x, and electrically connects to the signal pad 11C.

The via holes 20x and 20y may have an inverted cone shape such that a diameter of the hole opening at the one surface 20a of the insulator 20 is larger than a diameter of the hole at a bottom formed at the upper surface of the wiring layer 11.

Although the wiring pattern 21A, the shield pad 21B, and the signal pad 21C of the wiring layer 21 are illustrated in FIG. 1B using different reference numerals, the wiring pattern 21A, the shield pad 21B, and the signal pad 21C may be formed by the same process using the same material. The wiring pattern 21A, the shield pad 21B, and the signal pad 21C may have a structure in which an electroplated layer 212 is stacked on a seed layer 211.

A material forming the seed layer 211 may be the same as the material forming the seed layer 111, and a thickness of the seed layer 211 may be the same as the thickness of the seed layer 111. Line/space of the wiring pattern 21A may be the same as the line/space of the wiring pattern 11A, and planar shapes of the shield pad 21B and the signal pad 21C may be the same as the planar shapes of the shield pad 11B and the signal pad 11C.

The inorganic layer 22 covers a region on the one surface 20a of the insulator layer 20 not formed with the wiring layer 21, and also covers an upper surface and side surfaces of the wiring layer 21 along a concavo-convex of the wiring layer 21.

In other words, the inorganic layer 22 covers the region of the one surface 20a of the insulator layer 20 not formed with the wiring layer 21, and also covers an upper surface and side surfaces of the wiring pattern 21A along a concavo-convex of the wiring pattern 21A. In addition, the inorganic layer 22 covers an upper surface and side surfaces of the shield pad 21B along a concavo-convex of the shield pad 21B. Further, the inorganic layer 22 covers an upper surface and side surfaces of the signal pads 21C along a concavo-convex of the signal pad 21C.

The inorganic layer 22 includes an opening 22x. The opening 22x exposes a region (or central part) of the upper surface of the shield pad 21B excluding an outer edge part of the upper surface of the shield pad 21B. The opening 22x also exposes a region (or central part) of the upper surface of the signal pad 21C excluding an outer edge part of the upper surface of the signal pad 21C. Of course, the opening 22x may expose the entire region on the upper surface of the shield pad 21B. In addition, the opening 22x may expose the entire region on the upper surface of the signal pad 21C. A material forming the inorganic layer 22 may be the same as the material forming the inorganic layer 12, and a thickness of the inorganic layer 22 may be the same as the thickness of the inorganic layer 12.

Because the inorganic layer 22 is thin (that is, a thin film), the inorganic layer 22 is formed along the shapes of the wiring pattern 21A, the shield pad 21B, and the signal pad 21C, but does not fill a space between the adjacent wiring patterns 21A nor spaces between the wiring pattern 21A and each of the shield pad 21B and the signal pad 21C. In other words, the inorganic film 22 also has a concavo-convex shape.

The shield part 23 covers the wiring pattern 21A via the inorganic layer 22. The shield part 23 extends on the wiring pattern 21A, and covers the shield pad 21B via the inorganic layer 22. The shield part 23 fills the concavo-convex formed by the adjacent wiring patterns 21A and the concavo-convex formed by the wiring pattern 21A and the shield pad 21B that are adjacent, to form a planar layer on the wiring pattern 21A and the shield pad 21B. This planar layer has a flat upper surface. The shield part 23 is electrically connected to the shield pad 21B that is exposed within the opening 22x of the inorganic layer 22.

The shield part 23 may have a structure in which an electroplated layer 232 is stacked on a seed layer 231. A material forming the seed layer 231 may be the same as the material forming the seed layer 131, and a thickness of the seed layer 231 may be the same as thickness of the seed layer 131. A material forming the electroplated layer 232 may be the same as the material forming the electroplated layer 132, and a thickness of the electroplated layer 232 may be the same as the thickness of the electroplated layer 132.

The insulator layer 30 is formed on the one surface 20a of the insulator layer 20, to cover the inorganic layer 22, the signal pad 21C that is exposed within the opening 22x of the inorganic layer 22, and the shield part 23. A material forming the insulator layer 30 may be the same as the material forming the insulator layer 20, and a thickness of the insulator layer 30 may be same as the thickness of the insulator layer 20.

The wiring layer 31 is formed on one surface 30a of the insulator layer 30. The wiring layer 31 includes a shield pad 31B formed in the region B, and a signal pad 31C formed in the region C. The shield pad 31 and the signal pad 31C are external connection pads for connecting the wiring board 1 to an external circuit or the like.

The shield pad 31B is electrically connected to the shield part 23 that is exposed within a via hole 30y formed in the insulator layer 30, through the via hole 30y. More particularly, the shield pad 31B is formed on the one surface 30a of the insulator layer 30 at a position in a periphery of the via hole 30y that penetrates the insulator layer 30 and exposes a part of the upper surface of the shield part 23. The shield pad 31B extends within the via hole 30y to fill the via hole 30y, and electrically connects to the shield part 23.

Because the shield pad 31B is electrically connected to ground or a power source of the external circuit or the like, a potential of the shield part 13 and the shield part 23 becomes the same as that of the ground or the power source. As a result, a shielding effect is generated, to reduce generation of crosstalk noise between the adjacent wiring patterns 11A, between the adjacent wiring patterns 21A, and between the wiring pattern 11A and the wiring pattern 21A that are vertically adjacent to each other. The wiring pattern 11A and the wiring pattern 21A that are vertically adjacent to each other, refer to the wiring pattern 11A arranged above the wiring pattern 21A, and the wiring pattern 21A arranged below the wiring pattern 11A, that are mutually adjacent in a vertical direction.

The signal pad 31C is electrically connected to the signal pad 21C that is exposed within the via hole 30x formed in the insulator layer 30, through the via hole 30x. More particularly, the signal pad 31C is formed on the one surface 30a of the insulator layer 30 at a position in a periphery of the via hole 30x that penetrates the insulator layer 30 and exposes a part of the upper surface of the signal pad 31C. The signal pad 31C extends within the via hole 30x to fill the via hole 30x, and electrically connects to the signal pad 21C.

The via holes 30x and 30y may have an inverted cone shape such that a diameter of the hole opening at the one surface 30a of the insulator 30 is larger than a diameter of the hole at a bottom formed at the upper surface of the wiring layer 21.

Although the wiring pattern 31A, the shield pad 31B, and the signal pad 31C of the wiring layer 31 are illustrated in FIG. 1A and FIG. 1B using different reference numerals, the wiring pattern 31A, the shield pad 31B, and the signal pad 31C may be formed by the same process using the same material. The wiring pattern 31A, the shield pad 31B, and the signal pad 31C may have a structure in which an electroplated layer 312 is stacked on a seed layer 311.

A material forming the seed layer 311 may be the same as the material forming the seed layer 111, and a thickness of the seed layer 311 may be the same as the thickness of the seed layer 111. In order to facilitate external connection of the shield pad 31B and the signal pad 31C to the external circuit or the like, the thickness of the electroplated layer 312 may be greater than the thickness of the electroplated layer 112. Planar shapes of the shield pad 31B and the signal pad 31C may be the same as to the planar shapes of the shield pad 11B and the signal pad 11C.

[Wiring Board Manufacturing Method in First Embodiment]

Next, a wiring board manufacturing method in the first embodiment will be described. FIG. 2A through FIG. 2E and FIG. 3A through FIG. 3E are diagrams illustrating manufacturing processes of the wiring board in the first embodiment. Although a single wiring board is manufactured in this embodiment, it is of course possible to simultaneously manufacture a plurality of wiring boards, by simultaneously manufacturing parts corresponding to the plurality of wiring boards, and cutting the parts into individual pieces respectively forming the wiring board.

Figure 2A:
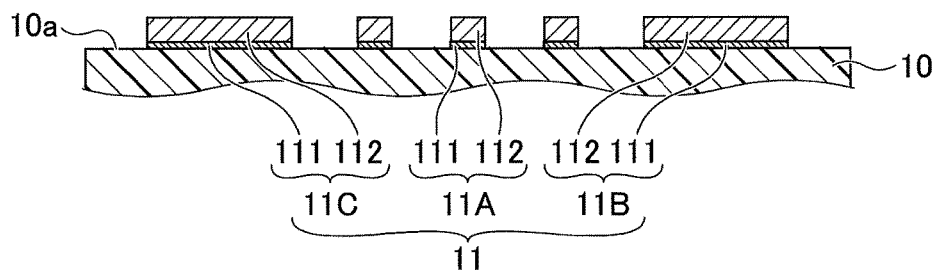
FIG. 2A, FIG. 2B, FIG. 2C, FIG. 2D, and FIG. 2E are diagrams illustrating manufacturing processes of the wiring board in the first embodiment.

First, in the process illustrated in FIG. 2A, the wiring layer 11, including the wiring pattern 11A, the shield pad 11B, and the signal pad 11C, is formed on the one surface 10a of the insulator layer 10. The insulator layer 11 may be formed, using a semi-additive method, for example. More particularly, the one surface 10a of the insulator layer 10 is continuously covered by the seed layer 11, using a sputtering method or an electroless plating method. Next, a photoresist is coated on the seed layer 111, and the photoresist is exposed and developed to form a resist layer having an opening corresponding to the wiring layer 11. Then, the electroplated layer 112 is formed on the seed layer 111 exposed within the opening of the resist layer, using an electroplating method that utilizes the seed layer 111 as a power feeding layer. Next, after removing the resist layer, the electroplated layer 112 is used as a mask, to remove a part of the seed layer 111 not covered by the electroplated layer 112, using an etching method. As a result, the wiring layer 11 in which the electroplated layer 112 is stacked on the seed layer 111, is formed on the one surface 10a of the insulator layer 10. The insulator layer 10, the seed layer 111, and the electroplated layer 112 may be made of the materials described above, and have the thicknesses and the shapes described above, for example.

Figure 2B:
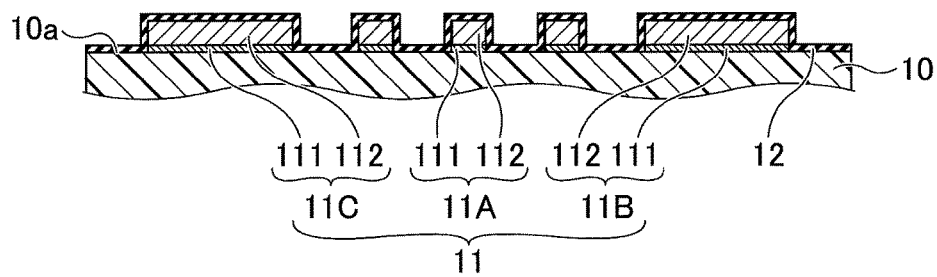

Next, in the process illustrated in FIG. 2B, the inorganic layer 12 is formed to cover the region of the one surface 10a of the insulator layer 10 not formed with the wiring layer 11, and the upper surface and the side surfaces of the wiring layer 11.

In other words, the inorganic layer 12 is formed to cover the region of the one surface 10a of the insulator layer 10 not formed with the wiring layer 11, and also cover the upper surface and the side surfaces of the wiring pattern 11A along the concavo-convex of the wiring pattern 11A. In addition, the inorganic layer 12 is formed to cover the upper surface and the side surfaces of the shield pad 11B along the concavo-convex of the shield pad 11B. Further, the inorganic layer 12 is formed to cover the upper surface and the side surfaces of the signal pad 11C along the concavo-convex of the signal pad 11C.

The inorganic layer 12 may be formed using the sputtering method, an ALD (Atomic Layer Deposition), or the like, for example. The inorganic layer 12 may be made of the material described above, and have the thickness and the shape described above, for example.

Figure 2C:
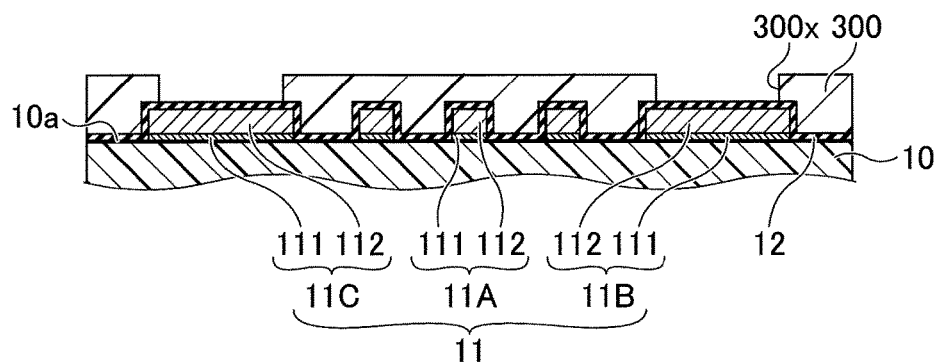

Next, in a process illustrated in FIG. 2C, a photoresist is coated on the inorganic layer 12, and the photoresist is exposed and developed to form a resist layer 300 having an opening 300x that exposes a region of the inorganic layer 12 where the opening 12x is to be formed.

Figure 2D:
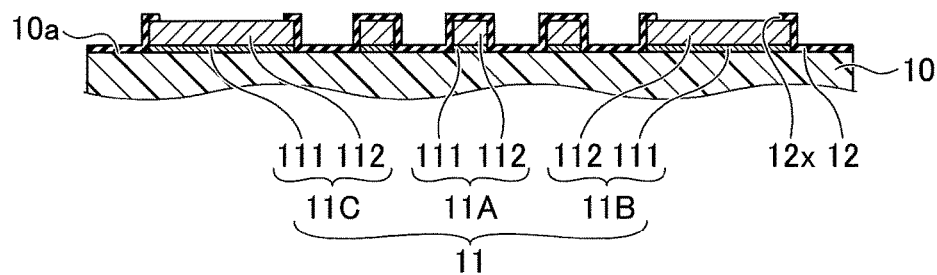

Next, in a process illustrated in FIG. 2D, after removing the inorganic layer 12 exposed within the opening 300x of the resist layer 300, using a dry etching method or the like, the resist layer 300 is removed using a stripping solution. As a result, the opening 12x is formed in the inorganic layer 12, to expose within the opening 12x, the region of the upper surface of the shield pad 11B excluding the outer edge part of the upper surface of the shield pad 11B, and the region of the upper surface of the signal pad 11C excluding the outer edge part of the upper surface of the signal pad 11C.

Figure 2E:
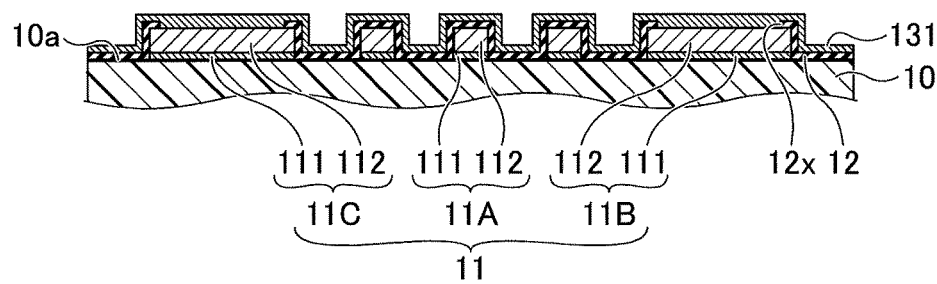

Next, in processes illustrated in FIG. 2E, FIG. 3A, FIG. 3B, and FIG. 3C, the shield part 13 is formed, using the semi-additive method, for example. More particularly, first, as illustrated in FIG. 2E, the seed layer 131 is formed, using the sputtering method or the electroless plating method, to continuously cover the shield pad 11B exposed within the opening 12x, the signal pad 11C exposed within the opening 12x, and the inorganic layer 12.

Figure 3A:
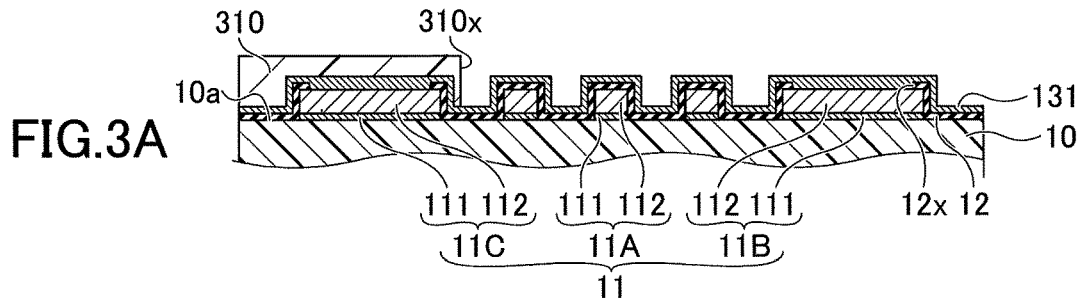
FIG. 3A, FIG. 3B, FIG. 3C, FIG. 3D, and FIG. 3E are diagrams illustrating manufacturing processes of the wiring board in the first embodiment.
Figure 3B:
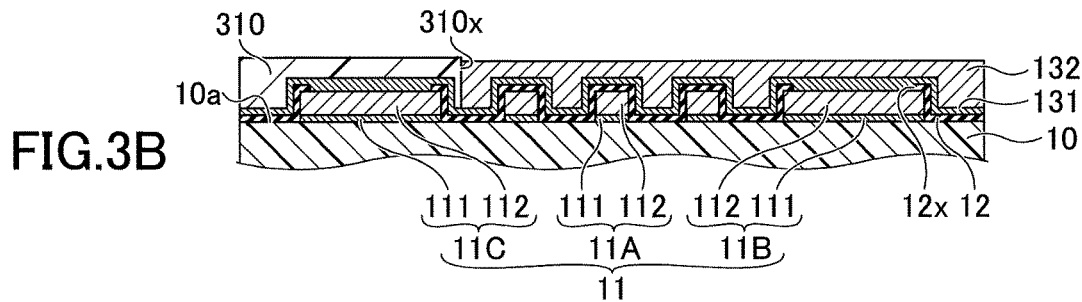

Next, in a process illustrated in FIG. 3A, a photoresist is coated on the seed layer 131, and the resist is exposed and developed to form a resist layer 310 having an opening 310x corresponding to the shield part 13. Next, in a process illustrated in FIG. 3B, the electroplated layer 132 is formed on the seed layer 131 exposed within the opening 310x of the resist layer 310, using the electroplating method that utilizes the seed layer 131 as the power feeding layer.

Figure 3C:
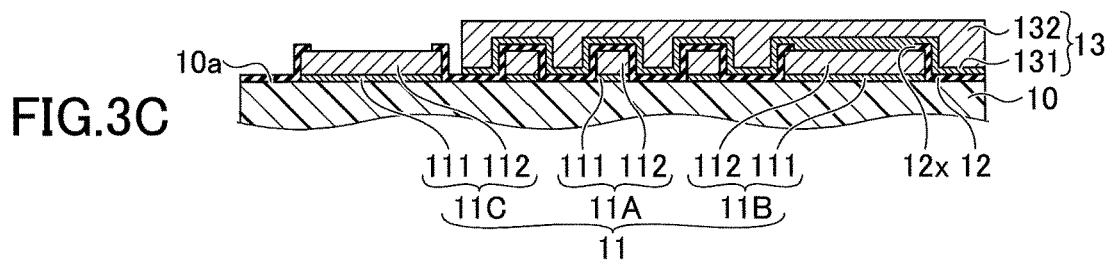

Next, in a process illustrated in FIG. 3C, after removing the resist layer 310, the electroplated layer 132 is used as a mask, to remove a part of the seed layer 131 not covered by the electroplated layer 132, using the etching method. As a result, the shield part 13, in which the electroplated layer 132 is stacked on the seed layer 131, is formed. The seed layer 131 and the electroplated layer 132 may be made of the materials described above, and have the thicknesses described above, for example.

Figure 3D:
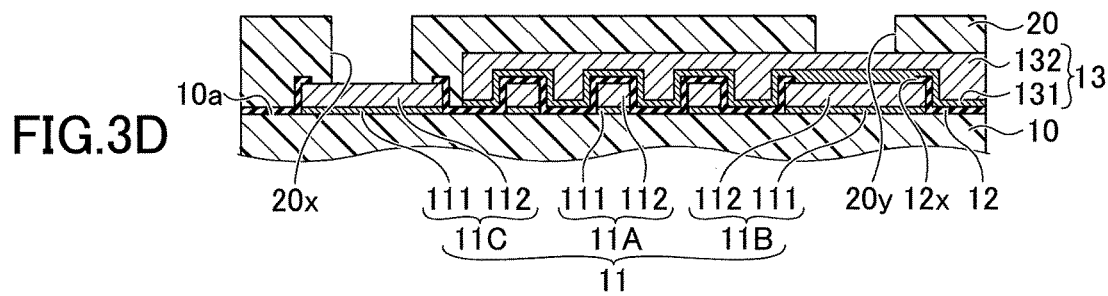

Next, in a process illustrated in FIG. 3D, the insulator layer 20 having the via holes 20x and 20y is formed on the one surface 10a of the insulator layer 10, to cover the inorganic layer 12, the outer edge part of the signal pad 11C exposed within the opening 12x of the inorganic layer 12, and the shield part 13. More particularly, the insulator layer 20 is formed on the one surface 10a of the insulator layer 10 by coating a photosensitive resin that is an insulator in liquid form or paste form, using a spin-coating method or the like, for example, to cover the inorganic layer 12, the signal pad 11C exposed within the opening 12x of the inorganic layer 12, and the shield part 13. Then, the insulator layer 20 is exposed and developed, to form the via hole 20x that selectively exposes a part of the upper surface of the signal pad 11C, and the via hole 20y that selectively exposes a part of the upper surface of the shield part 13.

Figure 3E:
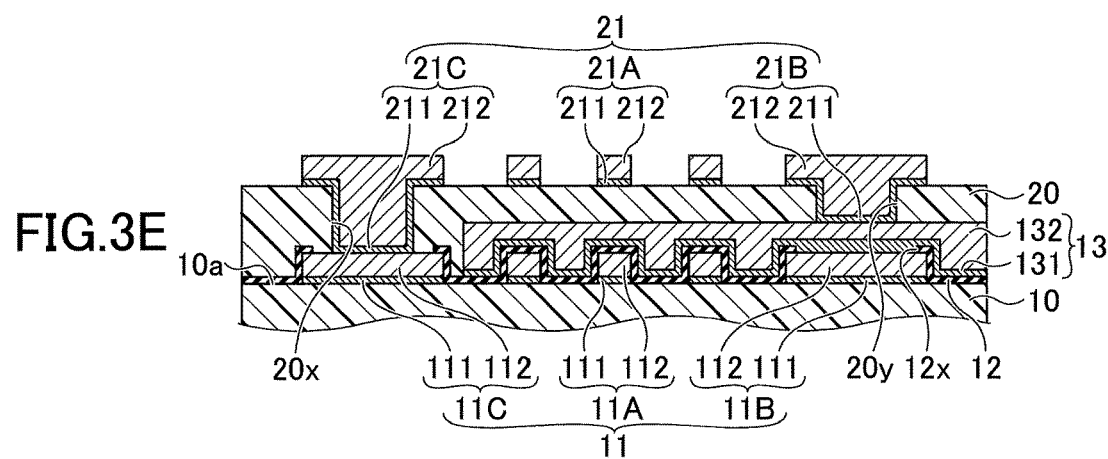

Next, in a process illustrated in FIG. 3E, the wiring layer 21, in which the electroplated layer 212 is stacked on the seed layer 211, is formed within the via holes 20x and 20y of the insulator layer 20 and on the insulator layer 20. The wiring layer 21 may be formed using the semi-additive method, for example, similarly to forming the wiring layer 11 and the shield part 13. The seed layer 211 and the electroplated layer 212 may be made of the materials described above, and have the thicknesses and the shapes described above, for example.

After the process illustrated in FIG. 3E, processes similar to the processes illustrated in FIG. 3D and FIG. 3E are repeated to form the insulator layer 30 and the wiring layer 31, to thereby complete the wiring board illustrated in FIG. 1A and FIG. 1B.

In addition, the process illustrated in FIG. 2B through FIG. 3E may be appropriately repeated, to form a multi-layer structure.

According to the wiring board in this embodiment, the thin inorganic layer is formed to cover the upper surface and the side surfaces of the wiring pattern along the concavo-convex of the wiring pattern. In addition, the shield part is provided to cover the wiring pattern via the inorganic layer. For this reason, even when the size of the wiring pattern is reduced, such that the line/space is approximately 1 μm/1 μm to approximately 5 μm/5 μm, for example, it is possible to reduce the crosstalk noise between the adjacent wiring patterns.

In addition, according to the wiring board in this embodiment, the wiring pattern and the shield part covering the wiring pattern are the same layer, and thus, the measures against the crosstalk noise does not increase the number of layers. Because the shield part has a thickness of approximately several μm, the wiring board can be made thin compared to a case in which the number of layers is increased as the measure against the crosstalk noise.

In a case in which an organic layer made of a resin or the like is used in place of the inorganic layer covering the upper surface and the side surfaces of the wiring pattern, it is difficult to form the organic layer along the concavo-convex of the wiring pattern, and the organic layer tends to become thick. Consequently, it is difficult to reduce the thickness of the wiring board when the organic layer is used in place of the inorganic layer covering the upper surface and the side surfaces of the wiring pattern.

According to each of the embodiments and modifications described above, it is possible to provide a wiring board and a wiring board manufacturing method, which can take measures against crosstalk noise without increasing the number of layers.

Various aspects of the subject-matter described herein may be set out non-exhaustively in the following numbered clauses:

1. A wiring board manufacturing method comprising:
    forming a first wiring layer, including a first wiring pattern, on one surface of a first insulator layer;
    forming a first inorganic layer on the one surface of the first insulator layer, and an upper surface and side surfaces of the first wiring pattern along a concavo-convex of the first wiring pattern; and
    forming a first shield part covering the first wiring pattern via the first inorganic layer.

2. The wiring board manufacturing method according to clause 1, wherein
    the forming the first inorganic layer forms the first inorganic layer having a concavo-convex shape along a concavo-convex formed by adjacent first wiring patterns, and
    the forming the first shield part forms the first shield part extending on the adjacent first wiring patterns by filling a concavo-convex formed by the adjacent first wiring patterns and the first inorganic layer.

3. The wiring board manufacturing method according to clause claim 1, wherein
    the forming the first wiring layer forms the first wiring layer including a first shield pad,
    the forming the first inorganic layer forms the first inorganic layer covering an upper surface and side surfaces of the first shield pad along a concavo-convex of the first shield pad,
    the forming the first inorganic layer forms the first inorganic layer including a first opening exposing the upper surface of the first shield pad, and
    the forming the first shield part forms the first shield part covering the first wiring pattern and the first shield pad via the first inorganic layer, and electrically connecting to the first shield pad exposed within the first opening.

4. The wiring board manufacturing method according to clause 3, further comprising:
    forming a second insulator layer covering the first shield part;
    forming a second wiring layer, including a second wiring pattern, on one surface of the second insulator layer;
    forming a second inorganic layer covering on the one surface of the second insulator layer, and an upper surface and side surfaces of the second wiring pattern along a concavo-convex of the second wiring pattern; and
    forming a second shield part covering the second wiring pattern via the second inorganic layer.

5. The wiring board manufacturing method according to clause 4, wherein
    the forming the second inorganic layer forms the second inorganic layer having a concavo-convex shape along a concavo-convex formed by adjacent second wiring patterns, and
    the forming the second shield part forms the second shield part extending on the adjacent second wiring patterns by filling a concavo-convex formed by the adjacent second wiring patterns and the second inorganic layer.

6. The wiring board manufacturing method according to clause 4, wherein
    the forming the second wiring layer forms the second wiring layer including a second shield pad electrically connected to the first shield part through a via hole formed in the second insulator layer, the forming the second inorganic layer forms the second inorganic layer covering an upper surface and side surfaces of the second shield pad along a concavo-convex of the second shield pad, the forming the second inorganic layer forms the second inorganic layer including a second opening exposing the upper surface of the second shield pad, the forming the second shield part forms the second shield part covering the second wiring pattern and the second shield pad via the second inorganic layer, and electrically connecting to the second shield pad exposed within the second opening.

7. The wiring board manufacturing method according to clause 4, wherein the forming the first wiring layer forms the first wiring layer including a first signal pad, the forming the first inorganic layer forms the first inorganic layer covering an upper surface and side surfaces of the first signal pad along a concavo-convex of the first signal pad, and including a third opening exposing the upper surface of the first signal pad.

8. The wiring board manufacturing method according to clause 7, wherein the forming the second wiring layer forms the second wiring layer including a second signal pad electrically connected to the first signal pad exposed within the third opening through a via hole formed in the second insulator layer, and the forming the second inorganic layer forms the second inorganic layer covering an upper surface and side surfaces of the second signal pad along a concavo-convex of the second signal pad.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a first insulator layer;
a first wiring layer, including a first wiring pattern, formed on one surface of the first insulator layer;
a first inorganic layer covering a region of the one surface of the first insulator layer not formed with the first wiring layer, and further covering an upper surface and side surfaces of the first wiring pattern along a concavo-convex of the first wiring pattern; and
a first shield part, made of a conductive material, and covering the first wiring pattern via the first inorganic layer, wherein
the first wiring layer includes a first shield pad,
the first inorganic layer covers an upper surface and side surfaces of the first shield pad along a concavo-convex of the first shield pad,
the first inorganic layer includes a first opening exposing the upper surface of the first shield pad, and
the first shield part covers the first wiring pattern and the first shield pad via the first inorganic layer, and is electrically connected to the first shield pad exposed within the first opening.

2. The wiring board as claimed in claim 1, further comprising:
a second insulator layer covering the first shield part;
a second wiring layer, including a second wiring pattern, formed on one surface of the second insulator layer;
a second inorganic layer covering a region of the one surface of the second insulator layer not formed with the second wiring layer, and covering an upper surface and side surfaces of the second wiring pattern along a concavo-convex of the second wiring pattern; and
a second shield part, made of a conductive material, and covering the second wiring pattern via the second inorganic layer.

3. The wiring board as claimed in claim 2, wherein
the second inorganic layer has a concavo-convex shape along a concavo-convex formed by adjacent second wiring patterns, and
the second shield part extends on the adjacent second wiring patterns by filling a concavo-convex formed by the adjacent second wiring patterns and the second inorganic layer.

4. The wiring board as claimed in claim 2, wherein
the second wiring layer includes a second shield pad,
the second inorganic layer covers an upper surface and side surfaces of the second shield pad along a concavo-convex of the second shield pad,
the second inorganic layer includes a second opening exposing the upper surface of the second shield pad,
the second shield part covers the second wiring pattern and the second shield pad via the second inorganic layer, and is electrically connected to the second shield pad exposed within the second opening, and
the second shield pad is electrically connected to the first shield part through a via hole formed in the second insulator layer.

5. The wiring board as claimed in claim 2, wherein
the first wiring layer includes a first signal pad,
the first inorganic layer covers an upper surface and side surfaces of the first signal pad along a concavo-convex of the first signal pad, and
the first inorganic layer includes a third opening exposing the upper surface of the first signal pad.

6. The wiring board as claimed in claim 5, wherein
the second wiring layer includes a second signal pad,
the second inorganic layer covers an upper surface and side surfaces of the second signal pad along a concavo-convex of the second signal pad, and
the second signal pad is electrically connected to the first signal pad exposed within the third opening through a via hole formed in the second insulator layer.

7. A wiring board comprising:
a first insulator layer;
a first wiring layer, including a first wiring pattern, formed on one surface of the first insulator layer;
a first inorganic layer covering a region of the one surface of the first insulator layer not formed with the first wiring layer, and further covering an upper surface and side surfaces of the first wiring pattern along a concavo-convex of the first wiring pattern; and
a first shield part, made of a conductive material, and covering the first wiring pattern via the first inorganic layer, wherein the first inorganic layer has a concavo-convex shape along a concavo-convex formed by adjacent first wiring patterns, the first shield part extends on the adjacent first wiring patterns by filling a concavo-convex formed by the adjacent first wiring patterns and the first inorganic layer, the first wiring layer includes a first shield pad, the first inorganic layer covers an upper surface and side surfaces of the first shield pad along a concavo-convex of the first shield pad, the first inorganic layer includes a first opening exposing the upper surface of the first shield pad, and the first shield part covers the first wiring pattern and the first shield pad via the first inorganic layer, and is electrically connected to the first shield pad exposed within the first opening.

8. The wiring board as claimed in claim 7, further comprising:

a second insulator layer covering the first shield part;

a second wiring layer, including a second wiring pattern, formed on one surface of the second insulator layer;

a second inorganic layer covering a region of the one surface of the second insulator layer not formed with the second wiring layer, and covering an upper surface and side surfaces of the second wiring pattern along a concavo-convex of the second wiring pattern; and a second shield part covering the second wiring pattern via the second inorganic layer.

9. The wiring board as claimed in claim 8, wherein the second inorganic layer has a concavo-convex shape along a concavo-convex formed by adjacent second wiring patterns, and the second shield part extends on the adjacent second wiring patterns by filling a concavo-convex formed by the adjacent second wiring patterns and the second inorganic layer.

10. The wiring board as claimed in claim 8, wherein the second wiring layer includes a second shield pad, the second inorganic layer covers an upper surface and side surfaces of the second shield pad along a concavo-convex of the second shield pad, the second inorganic layer includes a second opening exposing the upper surface of the second shield pad, the second shield part covers the second wiring pattern and the second shield pad via the second inorganic layer, and is electrically connected to the second shield pad exposed within the second opening, and the second shield pad is electrically connected to the first shield part through a via hole formed in the second insulator layer.

11. The wiring board as claimed in claim 8, wherein the first wiring layer includes a first signal pad, the first inorganic layer covers an upper surface and side surfaces of the first signal pad along a concavo-convex of the first signal pad, and the first inorganic layer includes a third opening exposing the upper surface of the first signal pad.

12. The wiring board as claimed in claim 11, wherein the second wiring layer includes a second signal pad, the second inorganic layer covers an upper surface and side surfaces of the second signal pad along a concavo-convex of the second signal pad, and the second signal pad is electrically connected to the first signal pad exposed within the third opening through a via hole formed in the second insulator layer.

\* \* \* \* \*